(12) United States Patent
Deaver, Sr.

(10) Patent No.: US 8,566,046 B2
(45) Date of Patent: *Oct. 22, 2013

(54) SYSTEM, DEVICE AND METHOD FOR DETERMINING POWER LINE EQUIPMENT DEGRADATION

(75) Inventor: Brian J. Deaver, Sr., Fallston, MD (US)

(73) Assignee: Current Technologies, LLC, Germantown, MD (US)

( * ) Notice: Subject to any disclaimer, the term of this patent is extended or adjusted under 35 U.S.C. 154(b) by 1135 days.

This patent is subject to a terminal disclaimer.

(21) Appl. No.: 12/353,420

(22) Filed: Jan. 14, 2009

(65) Prior Publication Data

US 2009/0187358 A1     Jul. 23, 2009

Related U.S. Application Data

(60) Provisional application No. 61/022,466, filed on Jan. 21, 2008.

(51) Int. Cl.
*G01R 31/00*     (2006.01)

(52) U.S. Cl.
USPC .......................................................... 702/58

(58) Field of Classification Search
USPC .......................................................... 702/58
See application file for complete search history.

(56) References Cited

U.S. PATENT DOCUMENTS

| | | |
|---|---|---|
| 3,967,264 A | 6/1976 | Whyte et al. |
| 4,570,231 A | 2/1986 | Bunch |
| 4,635,055 A | 1/1987 | Fernandes et al. |
| 4,758,962 A | 7/1988 | Fernandes |
| 5,006,846 A | 4/1991 | Granville et al. |
| 5,341,265 A | 8/1994 | Westrom et al. |
| 5,369,356 A | 11/1994 | Kinney et al. |

(Continued)

FOREIGN PATENT DOCUMENTS

EP     1 253 699 A2     10/2002

OTHER PUBLICATIONS

"Centralized Commercial Building Applications with the Lonworks ® PLT-21 Power Line Transceiver", *Lonworks Engineering Bulletin, Echelon*, (Apr. 1997), 1-22.

(Continued)

*Primary Examiner* — Stephen Cherry

(57) ABSTRACT

A system, method and device for detecting power grid equipment degradation is provided. In one embodiment, a method of using a device comprises measuring a first voltage of a first energized conductor of a power line connected to the output of a distribution transformer supplying power to one or more customer premises, processing data of the measured voltage to detect a trigger condition wherein the trigger condition comprises, at least in part, a change in the first voltage that extends for at least a first duration, and transmitting a notification of a detection of a trigger condition to a remote computer. The method may further include measuring a second voltage of a second energized conductor and wherein the trigger condition comprises detecting concurrently for at least the first duration a difference between the first voltage and the second voltage that exceeds a first threshold, and a sum of the first voltage and the second voltage that is within a predetermined voltage range. In addition, processing data of the measured voltage to detect a trigger condition may include comprise processing the data to determine whether the first voltage changes beyond a first threshold within a first predetermined maximum time period and remains beyond the first threshold for at least a second duration.

11 Claims, 4 Drawing Sheets

(56) References Cited

U.S. PATENT DOCUMENTS

| | | |
|---|---|---|
| 5,414,400 A | 5/1995 | Gris et al. |
| 5,498,956 A | 3/1996 | Kinney et al. |
| 5,568,399 A | 10/1996 | Sumic |
| 5,760,492 A | 6/1998 | Kanoi et al. |
| 5,777,545 A | 7/1998 | Patel |
| 6,072,858 A | 6/2000 | Bellin |
| 6,151,330 A | 11/2000 | Liberman |
| 6,687,574 B2 | 2/2004 | Pietrowicz et al. |
| 6,822,457 B2 | 11/2004 | Borchert et al. |
| 6,828,770 B1 | 12/2004 | McCauley et al. |
| 6,917,888 B2 | 7/2005 | Logvinov et al. |
| 7,069,117 B2 | 6/2006 | Wilson et al. |
| 7,089,125 B2 | 8/2006 | Sonderegger |
| 7,626,489 B2 | 12/2009 | Berkman |
| 8,077,049 B2 | 12/2011 | Yaney |
| 2001/0013771 A1 | 8/2001 | Wasmer |
| 2001/0052843 A1 | 12/2001 | Wiesman et al. |
| 2002/0000802 A1 | 1/2002 | Panto et al. |
| 2002/0053912 A1 | 5/2002 | Saha et al. |
| 2002/0064010 A1 | 5/2002 | Nelson et al. |
| 2002/0067171 A1 | 6/2002 | Lanan |
| 2002/0089802 A1 | 7/2002 | Beckwith |
| 2003/0052694 A1 | 3/2003 | Dindis et al. |
| 2003/0067725 A1 | 4/2003 | Horvath et al. |
| 2003/0105608 A1 | 6/2003 | Hart |
| 2003/0137388 A1 | 7/2003 | Meier et al. |
| 2004/0008461 A1 | 1/2004 | Kojovic et al. |
| 2004/0021455 A1 | 2/2004 | Staats |
| 2004/0027748 A1 | 2/2004 | Kojovie et al. |
| 2004/0036478 A1 | 2/2004 | Logvinov et al. |
| 2004/0061616 A1 | 4/2004 | Fischer et al. |
| 2004/0153215 A1 | 8/2004 | Kearney et al. |
| 2004/0160227 A1 | 8/2004 | Piesinger |
| 2004/0183522 A1 | 9/2004 | Gunn et al. |
| 2004/0189317 A1 | 9/2004 | Borchert et al. |
| 2004/0212512 A1 | 10/2004 | Stewart |
| 2004/0245994 A1 | 12/2004 | Schlapp et al. |
| 2005/0040809 A1 | 2/2005 | Uber, III et al. |
| 2005/0057227 A1 | 3/2005 | Rockwell |
| 2005/0083206 A1 | 4/2005 | Couch et al. |
| 2005/0141682 A1 | 6/2005 | Wells |
| 2006/0007016 A1 | 1/2006 | Borkowski et al. |
| 2006/0036795 A1 | 2/2006 | Leach |
| 2006/0060007 A1 | 3/2006 | Mekhanoshin et al. |
| 2006/0076946 A1 | 4/2006 | Shvach et al. |
| 2006/0084419 A1 | 4/2006 | Rocamora et al. |
| 2006/0087777 A1 | 4/2006 | Bruno |
| 2006/0106554 A1 | 5/2006 | Borkowski et al. |
| 2006/0119344 A1 | 6/2006 | Benke et al. |
| 2006/0119368 A1 | 6/2006 | Sela et al. |
| 2006/0171085 A1 | 8/2006 | Keating |
| 2006/0176631 A1 | 8/2006 | Cannon |
| 2006/0181284 A1 | 8/2006 | Fraedrich |
| 2006/0187074 A1 | 8/2006 | O'Sullivan et al. |
| 2006/0192672 A1 | 8/2006 | Gidge et al. |
| 2006/0195229 A1 | 8/2006 | Bell et al. |
| 2006/0217058 A1 | 9/2006 | Staszesky et al. |
| 2006/0241880 A1 | 10/2006 | Forth et al. |
| 2006/0271313 A1 | 11/2006 | Mollenlopf |
| 2006/0284647 A1 | 12/2006 | Gunn et al. |
| 2007/0014313 A1 | 1/2007 | Bickel et al. |
| 2007/0024264 A1 | 2/2007 | Lestician |
| 2007/0090811 A1 | 4/2007 | Labuschagne |
| 2007/0136010 A1 | 6/2007 | Gunn et al. |
| 2007/0179721 A1 | 8/2007 | Yaney |
| 2007/0179726 A1 | 8/2007 | Bickel |
| 2007/0185665 A1 | 8/2007 | Roytelman |
| 2007/0203658 A1 | 8/2007 | Patel |
| 2007/0213879 A1 | 9/2007 | Iwamura |
| 2007/0219755 A1 | 9/2007 | Williams et al. |
| 2007/0229295 A1 | 10/2007 | Curt et al. |
| 2007/0258175 A1 | 11/2007 | Montgomery et al. |
| 2007/0285079 A1 | 12/2007 | Nasle |
| 2008/0007416 A1 | 1/2008 | Cern |
| 2008/0048668 A1 | 2/2008 | Mashikian |
| 2008/0065342 A1 | 3/2008 | Zalitzky et al. |
| 2008/0077336 A1 | 3/2008 | Fernandes |
| 2008/0122642 A1 | 5/2008 | Radtke et al. |
| 2008/0143315 A1* | 6/2008 | Bickel ........................ 324/76.12 |
| 2008/0204054 A1 | 8/2008 | Wells |
| 2009/0085407 A1 | 4/2009 | Venkatasubramanian |
| 2009/0099798 A1 | 4/2009 | Gong et al. |
| 2009/0115254 A1 | 5/2009 | Dawley |
| 2009/0184835 A1 | 7/2009 | Deaver |
| 2009/0187284 A1 | 7/2009 | Kreiss et al. |
| 2009/0187285 A1 | 7/2009 | Yaney et al. |
| 2009/0187344 A1 | 7/2009 | Brancaccio et al. |
| 2009/0189594 A1 | 7/2009 | Cern |
| 2009/0228154 A1 | 9/2009 | Trias |
| 2009/0276170 A1 | 11/2009 | Bickel |
| 2010/0010761 A1 | 1/2010 | Nordebo et al. |
| 2010/0085036 A1 | 4/2010 | Banting et al. |
| 2010/0179779 A1 | 7/2010 | Taft |
| 2010/0179780 A1 | 7/2010 | Taft |

OTHER PUBLICATIONS

"Outlook Conference 2004: Amperion Deployment Overview", *Primen Conference*, (May 7, 2004),1-10.

\* cited by examiner

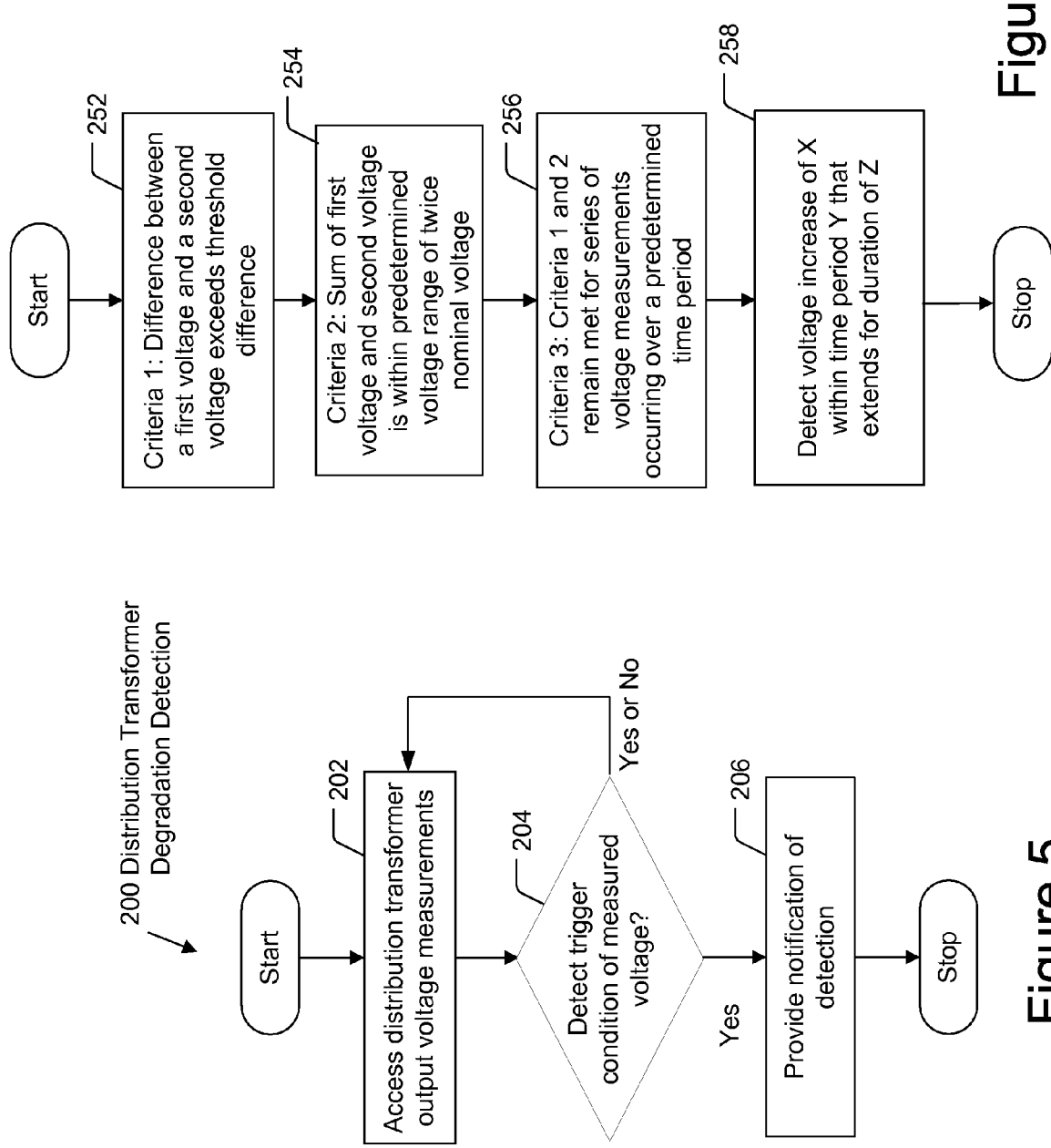

SYSTEM, DEVICE AND METHOD FOR
DETERMINING POWER LINE EQUIPMENT
DEGRADATION

CROSS REFERENCE TO RELATED
APPLICATIONS

This application claims the benefit of U.S. Provisional Application No. 61/022,466, filed Jan. 21, 2008, entitled "System, Device and Method for Determining Power Line Equipment Degradation," which is incorporated herein by reference in its entirety for all purposes.

FIELD OF THE INVENTION

The present invention generally relates to systems and methods for monitoring power lines and power line equipment, and more particularly to systems and methods for detecting power line equipment degradation.

BACKGROUND OF THE INVENTION

The power system infrastructure includes power lines, transformers and other devices for power generation, power transmission, and power delivery. A power source generates power, which is transmitted along high voltage (HV) power lines for long distances. Typical voltages found on HV transmission lines range from 69 kilovolts (kV) to in excess of 800 kV. The power signals are stepped down to medium voltage (MV) power signals at regional substation transformers. MV power lines carry power signals through neighborhoods and populated areas. Typical voltages found on MV power lines power range from about 1000 V to about 100 kV. The power signals are stepped down further to low voltage (LV) levels at distribution transformers. LV power lines typically carry power signals having voltages ranging from about 100 V to about 600 V to customer premises.

The reliability of the power system depends on the reliability of the various power lines, transformers, switching devices and other power system elements. Degradation may occur at any of the various components of the power system. For example, over time the insulation on a power line or transformer winding may degrade. Additionally, a faulty neutral connection may cause the load to be unbalanced. Such degradation may result in power being consumed within the system (e.g., losses), rather than by the end consumer. As a result, potential revenues are lost. Accordingly, there is a need to identify components which are degraded so that the power system operates at a higher efficiency.

When a component fails, one or more power customers may be without power. This is inconvenient to the consumer, as perishable items being refrigerated may spoil (and generally resulting in a large economic loss), heating or air conditioning needs may go unmet, and daily activities requiring electricity inconvenienced. Power failures also adversely affect the utility company. Potential revenues are lost during the down time. Additional costs may be incurred to locate and fix the cause of the power failure. Accordingly, there is a need to identify power equipment degradation before such power outages occur. Predicting failures before they occur benefits the customer and the power utility. In particular the utility company may take corrective action before such a failure occurs. These and other needs are addressed by one or more embodiment of present invention.

SUMMARY OF THE INVENTION

The present invention provides a system, method and device for detecting power grid equipment degradation. In one embodiment, a method of using a device comprises measuring a first voltage of a first energized conductor of a power line connected to the output of a distribution transformer supplying power to one or more customer premises, processing data of the measured voltage to detect a trigger condition wherein the trigger condition comprises, at least in part, a change in the first voltage that extends for at least a first duration, and transmitting a notification of a detection of a trigger condition to a remote computer. The method may further include measuring a second voltage of a second energized conductor and wherein the trigger condition comprises detecting concurrently for at least the first duration a difference between the first voltage and the second voltage that exceeds a first threshold, and a sum of the first voltage and the second voltage that is within a predetermined voltage range. In addition, processing data of the measured voltage to detect a trigger condition may include comprise processing the data to determine whether the first voltage changes beyond a first threshold within a first predetermined maximum time period and remains beyond the first threshold for at least a second duration.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings:

FIG. 5 is a flow chart of a method for detecting degradation of a distribution transformer, according to an example embodiment of the present invention; and FIG. 6 is a flow chart of criteria for detecting trigger conditions, according to an example embodiment of the present invention.

DETAILED DESCRIPTION OF ILLUSTRATIVE
EMBODIMENTS

In the following description, for purposes of explanation and not limitation, specific details are set forth, such as particular networks, devices, communication systems, computers, terminals, components, techniques, data and network protocols, power line communication systems (PLCSs), software products and systems, enterprise applications, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known networks, devices, communication systems, computers, terminals, components, techniques, data and network protocols, software products and systems, operating systems, development interfaces, and hardware are omitted so as not to obscure the description of the present invention.

According to an embodiment of the present invention, the output voltage of a plurality of transformers of the power distribution system are monitored to detect voltage signatures that are predictive of power grid degradation. One such degradation is degradation of winding insulation of a transformer. When the insulation of a winding degrades, the point of degradation may allow adjacent turns of a winding inside the transformer to short together. In other words, instead of the electricity traveling through the entire length of the winding, it may short through the degraded insulation from a first turn of the winding to an adjacent turn of the winding. This short changes the effective number of turns of that winding and, therefore, the turns ratio of the transformer. As a result, the output voltage of the transformer may change rapidly due to the rapid change in the effective turns ratio of the transformer. For example, when two turns of the primary winding (connected to the MV power line) of a distribution transformer short together, the effective turns on the primary winding is reduced by one or more turns. This change in the number of turns of the primary winding causes the voltage output on the low voltage power line to increase. Another type of degradation to be detected comprises a loose or broken neutral.

The presenting invention employs sensing devices to monitor the output voltage of a plurality of distribution transformers to detect a trigger condition. Once such trigger condition has been detected, a notification including the identity of the transformer may be sent to a remote computer. Depending upon the extent of the degradation, maintenance or other responsive steps may be taken to prevent a power distribution system failure.

Power Line Communication System 50

Figure 1:
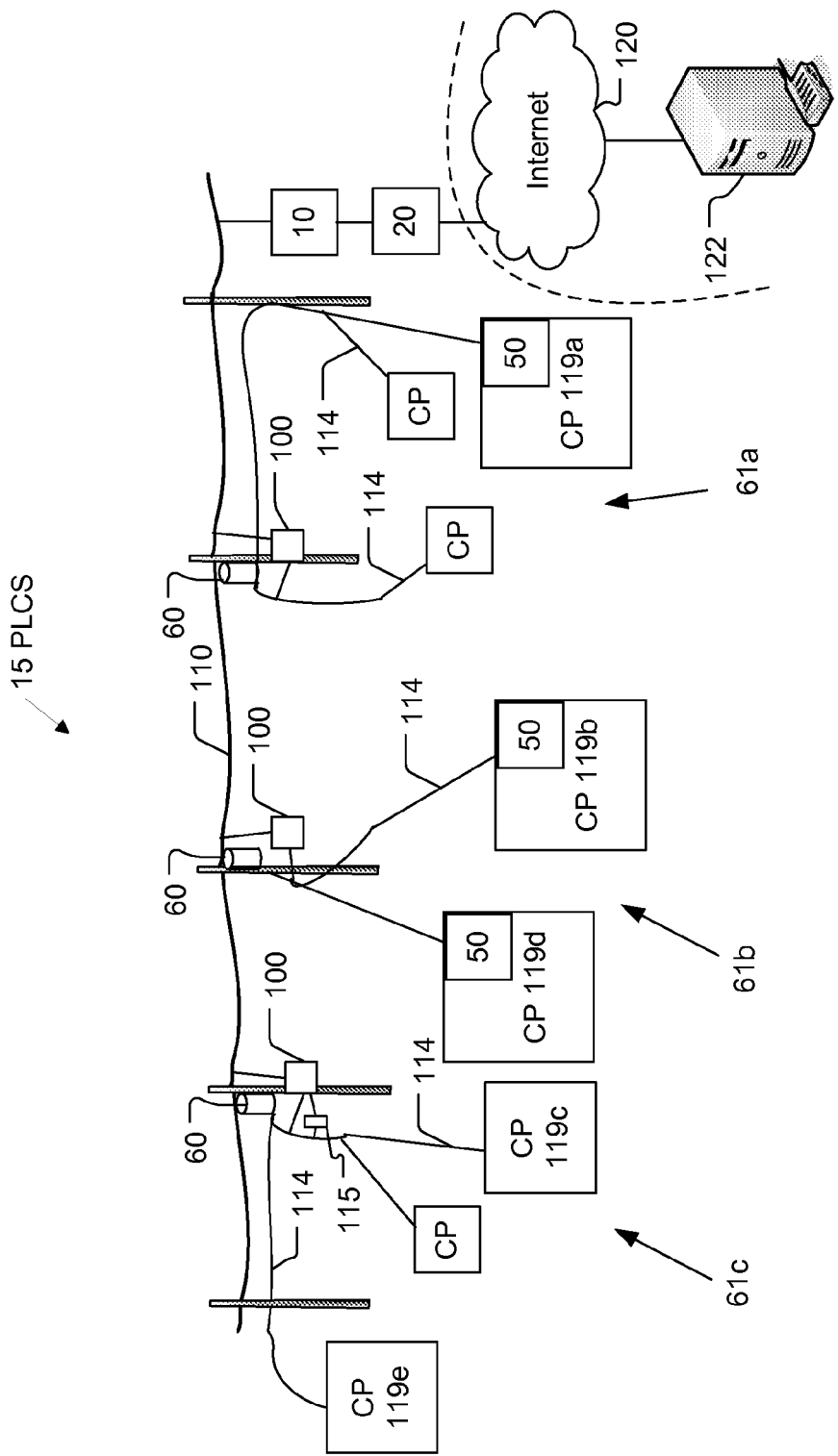
FIG. 1 is a diagram of a portion of a power line communication system for use with a power distribution network, according to an example embodiment of the present invention.

FIG. 1 shows a power line communication system 5 and a portion of a power distribution system for monitoring voltage and detecting power line equipment degradation, according to an example embodiment of the present invention. The power line distribution system 15 includes a plurality of distribution transformers 60 coupled at one terminal to a medium voltage (MV) power line 110 and at another terminal to respective low voltage (LV) power lines 114. Each low voltage power line 114 may extend to serve one or more customer premises (CP) 119, such as via a power meter 50, and include first and second energized conductor and a neutral conductor. The power line communication system (PLCS) 15 may include the power line communication devices 100 and sensing devices 115.

As discussed, MV typically ranges from about 1000 V to about 100 kV and LV typically ranges from about 100 V to about 1,000 V. Transformers 60 are used to convert between the respective voltage portions, e.g., between an MV section and an LV section. Transformers have a primary side for connection to a first voltage (e.g., the MV section) and a secondary side for outputting another (usually lower) voltage (e.g., the LV section). Such transformers 60 are often referred to as distribution transformers or a step down transformers, because they "step down" the voltage to some lower voltage. Transformers, therefore, provide voltage conversion for the power distribution system. Power may be carried from a substation transformer (coupled to the power grid) to a distribution transformer 60 over one or more MV power lines 110. Distribution transformers 60 may be pole-top transformers located on a utility pole, pad-mounted transformers located on the ground, or transformers located under ground level. Power is carried from the distribution transformer 60 to the customer premises 119a-e via one or more LV power lines 114.

The method of the present invention is applicable for use by a power line communication system (PLCS) 15 that may communicate signals to and from communication devices at the customer premises 119 (e.g., meters) via the MV power lines 110 and/or LV power lines 114. The PLCS 15 as shown in FIG. 1 may include one or more bypass devices (BD) 100 which communicate data signals around the distribution transformer 60 that would otherwise filter such data signals, preventing them from passing through the transformer or significantly degrading them. Thus, the BD 100 is the gateway between an LV power line subnet 61 (i.e., the devices that are communicatively coupled to the LV power lines 114) and the MV power line 110. The BDs 100 of this embodiment communicate signals to and from user devices (including power meters) at the customer premises (CP) 119 via the low voltage subnet 61. In other embodiments, the BDs 100 may communicate signals to and from communication devices at the customer premises 119 (e.g., meters) via wireless communication. Some PLCS embodiments may include an MV power line repeater, which may comprise a bypass device that repeats data between a backhaul point 10 and another bypass device 100.

In this exemplary embodiment, the BD 100 provides communication services, such as, for example, communicating data (power usage data), conditions (degradation trigger condition), and/or events detected by sensing devices communicatively coupled to the BD 100 or from a user device at a customer's premises 119. The communication services may encompass security management, routing of Internet Protocol (IP) packets, data filtering, access control, service level monitoring, signal processing and modulation/demodulation of signals transmitted over the power lines.

The illustrated example portion of the PLCS 15 includes a backhaul point 10 which may act as an interface and gateway between a portion of a PLCS 15 (e.g., an MV power line) and a traditional non-power line telecommunications network, (e.g., internet 120). For example, one or more backhaul points (BP) 10 may be communicatively coupled to an aggregation point (AP) 20 that in many embodiments may be at (e.g., co-located with), or connected to, the point of presence to the Internet 120. The BP 10 may be connected to the AP 20 using any available mechanism, including fiber optic conductors, T-carrier, Synchronous Optical Network (SONET), or wireless techniques well known to those skilled in the art. The BP 10 may include a transceiver suited for communicating through the communication medium.

The AP 20 may include a conventional Internet Protocol (IP) data packet router and may be directly connected to an Internet backbone thereby providing access to the Internet 120. Alternatively, the AP 20 may be connected to a core router (not shown), which provides access to the Internet, or other communication network. Depending on the configuration of the PLCS 15, a plurality of APs 20 may be connected to a single core router which provides Internet access. The core router (or AP 20 as the case may be) may route voice traffic to and from a voice service provider and route Internet traffic to and from an Internet service provider and/or video provider. The routing of packets to the appropriate provider may be determined by any suitable means such as by including information in the data packets to determine whether a packet is voice. If the packet is voice, the packet may be routed to the voice service provider and, if not, the packet may be routed to the Internet service provider. Similarly, the packet may include information (which may be a portion of the address) to determine whether a packet is Internet data. If the packet is Internet data, the packet may be routed to the Internet service provider and, if not, the packet may be routed to the voice service provider.

The aforementioned devices that comprise a typical PLCS 15 will herein collectively be referred to as power line communication devices. Each of the power line communication devices (BD, BP, MV repeater, etc.) may be coupled to each other through power lines and logical channels of communication, which will herein collectively be referred to as communication links.

Preferably, the PLCS 15 also includes a power line server (PLS) 122 that is a computer system with memory for storing a database of information about the PLCS 15 and includes a network element manager (NEM) that monitors and controls the PLCS 15. The PLS 122 additionally allows network operations personnel to provision users and network equipment, manage customer data, and monitor system status, performance and usage. The PLS 122 may reside at a remote network operations center (NOC), and/or at a PLCS Point of Presence (POP), to monitor and control a group of power line communication devices via the Internet 120. The PLS 122 may provide an Internet identity to the network elements by assigning the devices (e.g., user devices, the LV modems and MV modems of each BD 100, BPs 10, and AP 20) IP addresses and storing the IP addresses and other device identifying information (e.g., the device's location, address, serial number, etc.) in memory. The PLS 122 also may be connected to one or more APs 20 and/or core routers directly or through the Internet 120 and therefore can communicate with any of the BDs 100, user devices, and BPs 10 through the respective AP and/or core router.

Typically, the PLS 122 may store the hierarchical configuration of the BP 10, repeaters, and BDs 100 for each MV run in the network in its memory (or database) to help facilitate and maintain the desired route configuration. This hierarchy information may include address and other unique identifying information showing the following for each BP 10: 1) the BDs 100 directly communicating with the BP 10, 2) the BDs 100 directly communicating with the BP 10 and also acting as repeating BDs (RBDs) 100, 3) the BDs 100 communicating through a repeating BD 100 (RBD) and also acting as RBDs 100, and 4) the BDs 100 that are communicating through an RBD 100 (and are not acting as an RBD 100). The PLS 122 may also receive measurement data and/or notifications of detected degradation trigger conditions and transmit notifications to the appropriate utility computer system.

Figure 2:
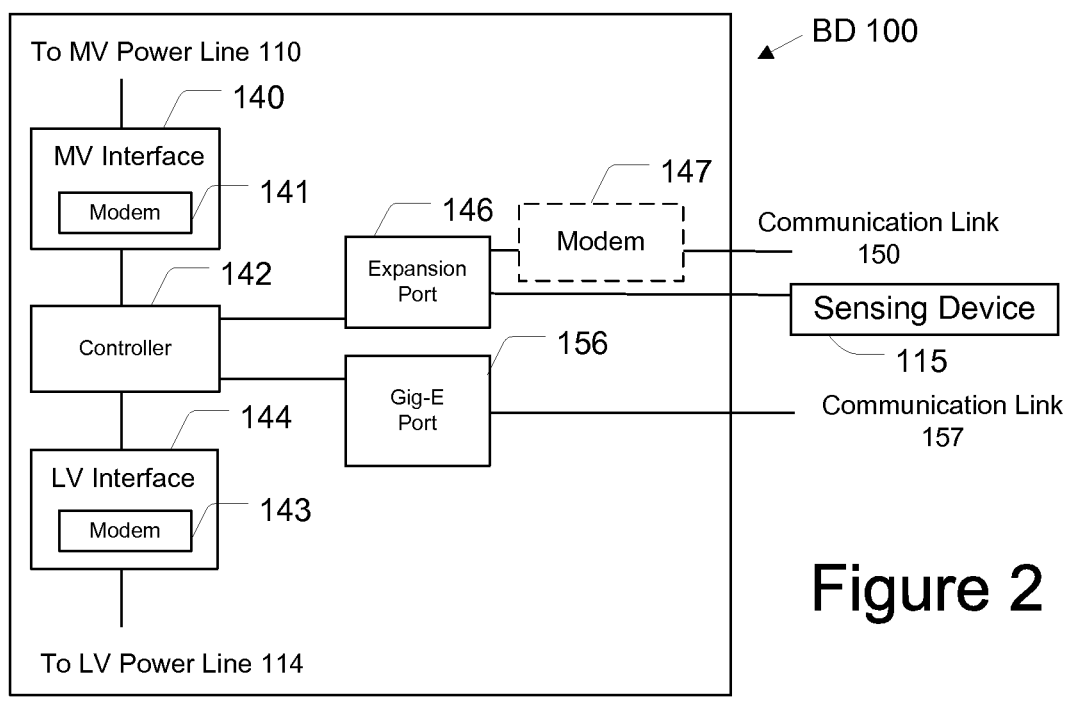
FIG. 2 is a block diagram of a bypass device of a power line communication system, according to an example embodiment of the present invention.

FIG. 2 shows an example embodiment of a bypass device (BD) 100 for monitoring parameters of the power distribution system, such as via sensing devices 115. As previously described, the BD device 100 also may be used for providing communication services to mobile devices and user devices at residences, buildings, and other locations. The BD 100 may include a medium voltage power line interface (MV interface) 140 having a MV modem 141, a controller 142, a low voltage power line interface (LV interface) 144 having a LV modem 143, and an expansion port 146, for connecting to devices, such as sensing device 115.

In some embodiments a sensing device 115 may be coupled to the BD 100 through the expansion port 146. The sensing device 115 may detect one or more parameters of the MV power line 110 and/or the LV power line 114, which, for example, may include power line voltage, power line current, detection of a power outage, power usage, detection of a street light failure, power delivered to a transformer, power factor (e.g., the phase angle between the voltage and current of a power line), power delivered to a downstream branch, harmonics, load transients, and/or load distribution. In one example embodiment, the sensing device 115 measures the voltage each low voltage energized conductor to ground (most low voltage power lines comprise two energized conductors and a neutral or ground conductor)

The BD 100 may include or be coupled to multiple sensing devices 115 so that parameters of multiple power lines may be measured such as a separate parameter sensing device 115 on each of three MV power line conductors and a separate parameter sensing device on each of two energized LV power line conductors and one on each neutral conductor. One skilled in the art will appreciate that other types of utility data also may be gathered. The sensing devices 115 described herein may be co-located with the power line communication device (e.g., BD 100, BP 10) with which the sensing device 115 communicates or may be displaced from such device (e.g., at the next utility pole or transformer).

In some embodiments a modem 147 may be coupled to the expansion port 146. For example, the BD 100 may be coupled to a LV power line 114, MV power line 110 and sensing device 115, and having a wireless communication interface for maintaining a wireless communication link 150. A wireless link 150 may be established with a cell phone, car phone, a computing device (or the PLS via a mobile telephone or paging network). For example, the wireless communication link 150 may be established with a mobile telephone cell site configured to provide mobile telephone communications (digital or analog) and use the signal set and frequency bands suitable to communicate with mobile phones, PDAs, and other devices configured to communicate over a mobile telephone network. Mobile telephone cell sites, networks and mobile telephone communications of such mobile telephone cell sites, as used herein, are meant to include analog and digital cellular telephone cell sites, networks and communications, respectively, including, but not limited to AMPS, 1G, 2G, 3G, GSM (Global System for Mobile communications), PCS (Personal Communication Services) (sometimes referred to as digital cellular networks), 1x Evolution-Data Optimized (EVDO), and other cellular telephone cell sites and networks. One or more of these networks and cell sites may use various access technologies such as frequency division multiple access (FDMA), time division multiple access (TDMA), or code division multiple access (CDMA) (e.g., some of which may be used by 2G devices) and others may use CDMA2000 (based on 2G Code Division Multiple Access), WCDMA (UMTS)—Wideband Code Division Multiple Access, or TD-SCDMA (e.g., some of which may be used by 3G devices). In some embodiments, the BD 100 may use the wireless port (modem 147) to communicate triggering conditions and measured data instead of the power lines (and therefore need not include an MV interface 140).

The BD 100 also may include a gigabit Ethernet (gig-E) port 156. The gig-E port 156 may add significant versatility to the BD 100. For example, the gig-E port 156 may maintain a communication link 157 with another BD 100, a BP 10 or a repeater. Further, the Gig-E port 156 may maintain an Ethernet connection for communicating with various devices over optical fiber, coaxial cable or other wired medium. For example, the local gig-E port allows a communication link 157 for connecting to high bandwidth devices (e.g., WiMAX (IEEE 802.16) or other wireless devices). Exemplary devices may include user devices, a mobile telephone cell cite, and sensing devices (as described above with regard to the expansion port 146.

The BD 100 may receive data from the MV interface 140, LV interface 144, the expansion port 146, or the gig-E port 156 and may route the data to the MV interface 140, LV interface 144, expansion port 146, or gig-E port 156 under the direction of the controller 142. In one example embodiment, the BD 100 may be coupled to a BP 10 via a wired medium coupled to Gig-E port 156 while in another embodiment, the BD 100 may be coupled to the BP 10 via an MV power line 110 (via MV interface 140). In yet another embodiment, the BD 100 may be coupled to a BP 10 via a wireless link (via transceiver connected to expansion port 146 or Gig-E port 156).

The controller 142 may include program code that is executable to control the operation of the BD 100 and to process measured parameter data to, for example, convert the measured data to average current, average voltage, power factor data, or impedance data. The BD 100 may also include a router, which routes data along an appropriate path. In this example embodiment, the controller 142 may include program code for performing routing (hereinafter to include switching and/or bridging). Thus, the controller 142 may maintain a table (e.g., a routing table) that identifies which communication device(s) is connected to each port in memory. The controller 142 may receive data from the MV interface 140, LV interface 144, gig-E port 156 or the expansion port 146, and may route the received data to the MV interface 140, LV interface 144, the expansion port 146, or gig-E port 156. In an example embodiment, user data may be routed based on a destination address of the packet (e.g., the IP destination address). Not all data packets, of course, are routed. Some packets received may not have a destination address for which the particular BD 100 routes data packets (and be ignored by the device 1100). Additionally, some data packets may be addressed to the BD 100. In such case the BD 100 may process the data as a control message. Thus, the controller 142, of this embodiment, matches data packets with specific messages (e.g., control messages) and destinations, performs traffic control functions, and performs usage tracking functions.

The BP 10 and repeaters may include a similar structure as the BD 100. For example, in various embodiments the BP 10 or repeater may include an MV interface; an LV interface; a controller 142, expansion port 146, and gig-E port 156. Various sensing devices 115 may be connected to the BP 10, such as through the expansion port 146 or via other means (e.g., a dedicated sensor device interface).

Equipment Degradation

An example of equipment degradation is degradation of the insulation of a winding of a distribution transformer 60. A distribution transformer 60 includes two windings that are inductively coupled to transfer energy from one circuit (e.g., the MV power line connected to the primary winding) to another circuit (e.g., the LV power line connected to the secondary winding). The voltage output of the distribution transformer is based on the respective number of turns of each winding, (e.g., the turns ratio of the two windings). The wire forming a winding is protected by insulation and adjacent turns of the winding are adjacent and distinct.

When the insulation of a winding degrades, the point of degradation may allow adjacent turns of a winding inside the transformer to short together. In other words, instead of the electricity traveling through the entire length of the winding, electricity may short through the degraded insulation to an adjacent turn of the winding. This short changes the effective number of turns of that winding and, therefore, the turns ratio of the transformer. As a result, the output voltage of the transformer may change rapidly due to the rapid change in the effective turns ratio of the transformer. For example, when two turns of the primary winding (connected to the MV power line) of a distribution transformer short together, the effective turns on the primary winding is reduced by one or more turns. This change in the number of turns of the primary winding causes the voltage output on the low voltage power line to increase. In some instances a transformer problem also may appear as a decrease in output voltage, such as when two turns on the secondary winding (the LV side) of the transformer short together.

Figure 3:
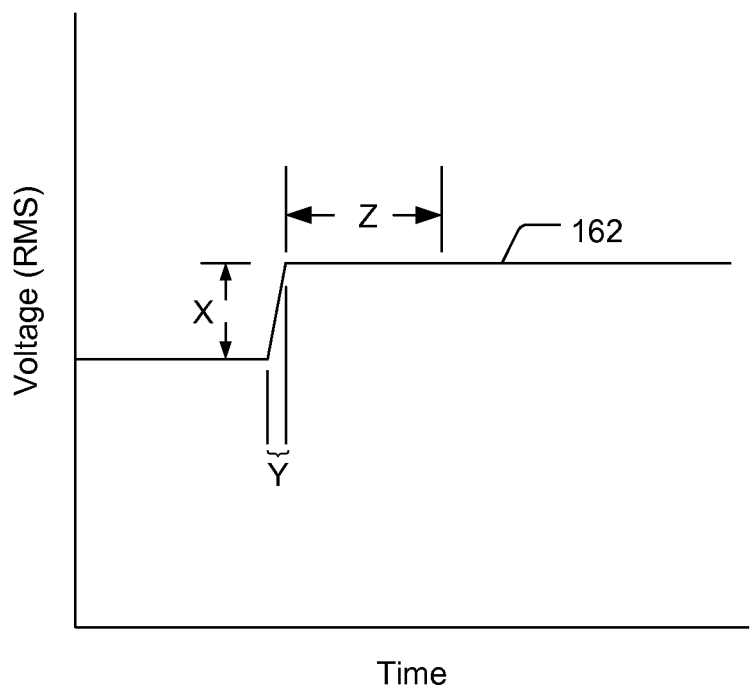
FIG. 3 is an example graphical representation of a transformer output voltage for a transformer experiencing an example winding degradation.

FIG. 3 shows an example of a given transformer's RMS output voltage 162 for a given energized conductor. Under normal conditions, the RMS voltage remains generally constant at a nominal voltage of about 120 volts (which may vary from network to network). While the voltage may vary somewhat over time due to changes in the voltage supplied and the load, a sudden change is not typical. However, when a pair of turns of a winding short together a rapid increase (or decrease) in output voltage occurs. The change in voltage may last from one to many cycles, or may even be prolonged and continuous, such as in the example illustrated. Once a degraded winding is detected, typically such a transformer will be scheduled for replacement since insulation failure is predictive of complete failure of the transformer.

In summary, a primary winding degradation fault may appear as a step function change in the voltage that persists at the underperforming transformer, while not being evident in surrounding transformers, as illustrated in FIG. 3. The step function may be algorithmically defined by three configurable variables: a percent Voltage Step Function Change (X), a Step Function Time Period (Y), and a Step Function Duration (Z). Thus, when the LV power line RMS voltage (of either LV conductor) increases more than X volts (e.g., a percentage above the nominal or an absolute value) in Y or fewer seconds and last for at least Z seconds—the BD 100 or other network element serving the transformer may transmit a notification to the PLS 122. The values of these variables may be transmitted from the PLS 122 for storage in the BDs 100 and may be periodically updated. Note that in some instances a step down in voltage may occur, and also be of concern and result in a notification. The PLS 122 in turn may process data from the notification. For example, when the power line RMS voltage (of either LV conductor) decreases more than X volts (e.g., a percentage or absolute value) in Y or fewer seconds and last for at least Z seconds—the BD 100 or other network element serving the transformer may transmit a notification to the PLS 122. The notification includes information sufficient for determining the transformer's location and may be processed to determine the transformers' location based on the unique ID of the transmitting device (BD 100) and other data stored in memory. A pole number, for example, may be associated in memory with a given power line communication device and distribution transformer 60.

In some embodiments a report is generated. For example, an incipient transformer failure report may display transformers which indicate a potential primary side winding degradation over the report time period. In particular, the report may graphically depict the voltage change (the step function) that occurred when the output voltage changed by more than X volts within Y seconds and lasted for more than Z seconds. Similarly the report may show failures of the secondary side (indicated by a rapid voltage decrease depicted by a step function). In various embodiments the report may be generated in real time upon detection of a trigger condition (step up or step down in output voltage of a given transformer or loose neutral described below). Reports also may be generated as part of a routine maintenance procedure or ad hoc in response to an operator command. In various embodiments the detection may be performed at a local power line communication device (e.g., BD 100) serving a given transformer and the report generated by the PLS 122 or a computer connected to the database storing the data and/or notifications.

In some embodiments, additional data may be collected and analyzed to confirm the need to repair or replace the transformer. For example, as part of the detection protocol the PLS 122 may request the time stamped data of the voltage output of nearby transformers 60 (transformers connected to the same MV power line and near the transformer having a detected degradation condition) as measured by other BDs 100 or determine if such other BDs have transmitted notifications of a similar trigger condition. If nearby transformers are experiencing the same voltage change at substantially the same time, the measurement data may indicate an MV power line voltage change, rather than insulation degradation at a specific transformer.

Figure 4:
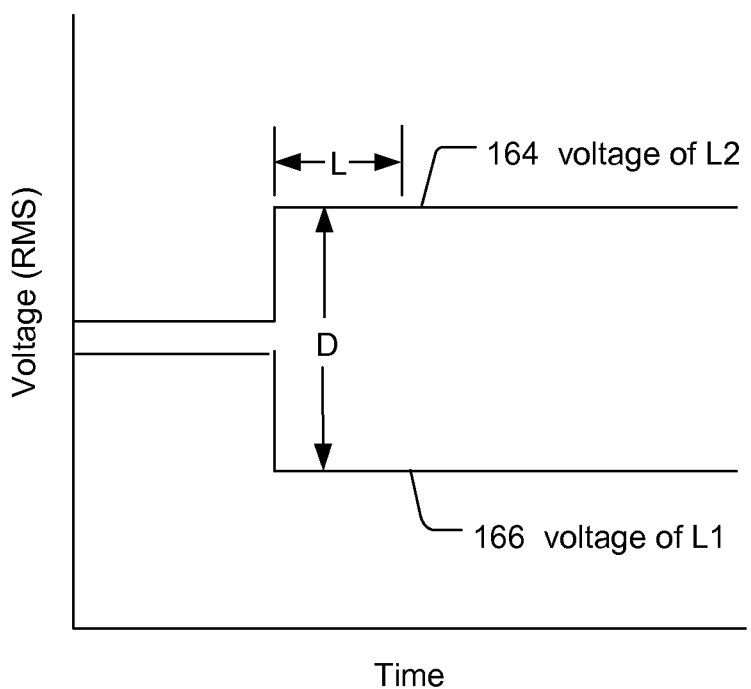
FIG. 4 is an example graphical representation graph of a transformer output voltage for a transformer experiencing an example loose or broken neutral conductor.

Other types of trigger events may be predictive of a failure or indicate an inefficiency. FIG. 4 shows a given transformer's RMS voltage output for another type of problem—a loose or broken neutral connection that may comprise an incipient secondary neutral failure. This trigger condition may occur when a transformer's neutral becomes loose (i.e., not securely adequately connected to the transformer or a remote connection) or broken. The processing to detect a loose or broken neutral may occur at the local BD 100, at a BP 10 serving the BD 100, or at the PLS 122. Line 164 of FIG. 4 represents the RMS voltage of a first energized low voltage conductor L1, while line 166 represents the RMS voltage of a second energized LV conductor L2—both of which are connected to the secondary of the same distribution transformer. Under normal conditions the RMS voltage on each of the two conductors generally varies only slightly due to changes in the MV voltage and the load. The respective voltages may be equal or may differ slightly as shown. The sum of the voltages typically remains generally constant at approximately at twice the nominal voltage (twice 120 volts in this example) or 240 volts. This process is applicable for U.S. residential transformers which have a 240 volt LV winding that is split into two 120 volt legs. A similar process may be used for U.S. three phase loads and European single and three phase loads.

A difference between the voltages of the two energized conductors of a typical volt single phase distribution transformer can provide an indication of a loose or broken neutral wire. The trigger condition indicating a loose or broken neutral is for the RMS voltage of one conductor to increase, and on the RMS voltage of the other conductor to decrease, with the sum of the two voltages remaining substantially the same as twice the nominal voltage (e.g., twice 120 volts or 240 volts). For example, if the voltage on a first conductor is 119 volts (indicated by line 166) and the voltage on the second conductor is 121 volts (indicated by line 164), a loose neutral may result in the voltage of the first conductor decreasing to 105 volts and the voltage of the second conductor increasing to 135 volts as illustrated in FIG. 4. This pattern may occur when the load is not balanced, such as when the neutral becomes disconnected.

To determine when this trigger condition occurs, the duration, range and difference of the voltages of the two energized conductors are monitored. The measured values are compared to a predetermined minimum duration (L), a range (R) and a minimum difference parameter (D) where L and D are denoted in FIG. 4. The difference parameter is a minimum difference in voltage between the two conductors L1 and L2. The range parameter is a voltage window that specifies a range of the sum of voltages or how similar the sum of the voltages of the two conductors must be to twice the nominal voltage. For example, a range of 12 volts means that the sum of the two voltages (of L1 and L2) must be within 12 volts of twice the nominal voltage (e.g., must be within 12 volts of 240 volts). The duration parameter indicates the length of time the voltages of the two conductors L1 and L2 must satisfy the range and difference parameters. Thus, detection of a degraded secondary neutral is triggered when three criteria are met: (i) the measured difference exceeds the difference parameter value, and (ii) the sum of the two voltages remains within the range parameter value of a nominal voltage, and (iii) both (i) and (ii) occur for at least for the duration specified by the duration parameter. Again, values for these parameters may be transmitted to the BDs 100 for storage therein by the PLS 122 and may be periodically updated.

Consider an example in which the difference parameter D is 16 volts, the range parameter is 12 volts, and the duration parameter L is five seconds. Normally the voltage of a first conductor L1 and second conductor L2 remain at approximately a nominal voltage (e.g., 120 volts) such as 119 volts RMS and 121 volts RMS, respectively. When a neutral conductor becomes loose or broken, the voltage 166 of L1 may decrease for example to 110 volts RMS and the voltage 164 of L2 may increase to 128 volts RMS. In this example, the difference between the voltages 164, 166 has increased to 18 volts (128 minus 110). This exceeds the 16 volt difference parameter and satisfies the first criteria. The sum of the two voltages is 238 volts (128 plus 110), which is within the required 12 volts range parameter value of twice the nominal voltage (twice 120 volts or 240 volts) and therefore the second criteria is met. If these voltage conditions persist for a duration exceeding the five second duration parameter, then detection of a neutral degradation condition is triggered.

The purpose of including the range parameter among the criteria for detecting the neutral degradation is to avoid false detections. In particular, the difference between the voltages of the two conductors may exceed the difference parameter for the required duration, but the range parameter condition may not be satisfied. For example, the voltage of one conductor may change significantly due to heavy load conditions. Consider the example where the voltages on the two conductor start at 119 and 121 volts, and a heavy load occurs causing the voltage on one of the conductors to drop to 104 volts, while the voltage on the other conductor remains at 121. Note that the difference condition is met, (i.e., 121 volts-104 volts is greater than 16 volts). However, the range condition is not met. The sum of the two voltages is 225 volts, which is 15 volts different form twice the nominal voltage of 120 volts is 240 volts. To satisfy the range condition, the sum would need to be greater than 228 volts (240 volts minus 12 volts and less than 252 volts (240 volts plus 12 volts). In this example, the sum equals 225 volts and is not within the voltage range (e.g., 12 volts) of twice the nominal voltage of 240 volts.

FIG. 5 shows a flow chart of a method 200 for detecting equipment degradation at a distribution transformer 60, according to an example embodiment of the present invention. At step 202, output voltage measurements are accessed for a given transformer 60. As shown in FIG. 1, a power line communication device, such as a bypass device (BD) 100 may be co-located with, or in the vicinity of, a distribution transformer 60. One or more sensing devices 115 also may be co-located with and/or form part of the BD 100. For example, a sensing device 115 may be coupled to the low voltage side of a distribution transformer 60. The sensing device 115 may measure the voltage on each low voltage energized conductor of the low voltage power line (although other parameters such as current also may be measured as previously described). In some embodiments the sensing device 115 may include a buffer for storing a sequence of measurements. The BD 100 may receive measurement data from the sensing device 115 periodically, a periodically, or in response to specific commands or protocols. Such data may be stored in memory. Accordingly, data of a series of measurements by the sensing device 115 may be stored in memory of the BD 100 and analyzed by the BD 100. In addition, such measurement data, in addition or alternatively, may be sent by the bypass device 100 to the PLS 122 for analysis and performing the remaining steps.

At step 204, data of the measured voltages is analyzed to determine whether, for example, the RMS output voltage of the distribution transformer 60 satisfies a characteristic trigger condition for one or more various degradation conditions. Exemplary degradation conditions that may be detected may include either or both of transformer winding insulation degradation and a degraded neutral connection. The voltage characteristics of these degradation condition are described in great detail above. The processing may be performed in accordance with parameters (e.g., of voltage thresholds, ranges, durations, etc.) that are stored in memory of the BD or PLS.

If a trigger condition is not detected (and in some embodiments, even if a trigger condition is detected—so that additional trigger conditions can be detected), the process continues at step 202. When a trigger condition is detected at step 204, a notification is provided. For example, when the analysis is performed at the BD 100 or a BP 10, a notification may be transmitted to a remote computer, such as the PLS 122. In some embodiments the analysis may be performed at the PLS 122 or another computer and the notification may be transmitted by the PLS 122 (or another computer) to a utility computer system. Depending upon the extent of the degradation, maintenance or other responsive steps may be taken to prevent a power distribution system failure. The notification may include data which is sufficient for determining, alone or in combination with data already known, the location of the transformer in question. In addition, even though a notification is provided, the process may also continue to process step 202 to process additional data. In some embodiments a report may be generated in real time, as part of a routine maintenance procedure, or ad hoc in response to an operator command. In other embodiments the notification may be transmitted via fiber, coaxial cable, twisted pair, or wirelessly such as, for example, via a mobile telephone network, paging network, WiMAX network, WAN, or other suitable network.

FIG. 6 shows an example method of implementing process 204 of FIG. 5, for detecting a trigger condition for a degraded neutral condition and a winding degradation, according to an example embodiment of the present invention. Voltage measurements may be obtained for voltages of both energized conductors of a power line connected to the secondary side of the distribution transformer. Data of a series of such voltage measurements may be accessed as previously described. At step 252, the difference between the voltages at each conductor is determined for a given sample time. Criteria 1 is met when the difference between the two voltages (e.g., RMS voltage) exceeds a first threshold value. The same output voltages also are summed. Criteria 2 is met when the sum is within a prescribed range of twice a nominal voltage for the power line (e.g., within 12 volts of twice 120 volts or 240 volts). These computations are performed on a series of measurements. Criteria 3 is met when criteria 1 and 2 are met for a series of voltage measurements spanning a predetermined time period. An example of the analysis of the three criteria also has been described above with regard to FIG. 4.

In addition, at step 258 the data of the voltage measurements of either or both energized conductors is processed to detect a voltage increase above a second threshold that occurs within a predetermined time period and that extends for a predetermined duration, which as discussed above may be indicative of degraded insulation of a winding of the transformer. This process is discussed in more detail with respect to FIG. 3. As will be evident to those skilled in the art, process step 258 may be performed before, after, or concurrently with processes 252-256. In addition, in practice, if criteria 1 is not met by process step 252, process steps 254 and 256 need not be performed for that set of data.

In other embodiments, other equipment degradation conditions may be detected, such as degraded URD cables, insulators, capacitor banks and volt regulators.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method using a device to detect power grid equipment degradation, comprising:

measuring a first voltage of a first energized conductor of a power line connected to the output of a distribution transformer supplying power to one or more customer premises;

processing data of the measured voltage to detect a trigger condition; wherein the trigger condition comprises, at least in part, a change in the first voltage that extends for at least a first duration;

transmitting a notification of a detection of a trigger condition to a remote computer; and measuring a second voltage of a second energized conductor, wherein the notification includes data for use in identifying a location of the distribution transformer, wherein the power line carries a nominal voltage on each energized conductor and wherein the trigger condition comprises concurrently for at least the first duration:

a) a difference between the first voltage and the second voltage that exceeds a first threshold; and b) a sum of the first voltage and the second voltage that is within a predetermined range of twice the nominal voltage.

2. The method according to claim 1, wherein said processing data of the measured voltage to detect a trigger condition comprises:

processing the data to determine whether the first voltage changes beyond a first threshold within a first predetermined maximum time period and remains beyond the first threshold for at least a second duration.

3. The method according to claim 1, wherein said providing the notification comprises transmitting the notification over a communication path that includes a medium voltage power line.

4. The method according to claim 1, wherein said providing the notification comprises wirelessly transmitting the notification.

5. A device for detecting power grid equipment degradation, comprising:
- a first measurement circuit for measuring a first voltage of a first energized conductor of a power line connected to the output of a distribution transformer supplying power to one or more customer premises;
- a second measurement circuit configured to measure a second voltage of a second energized conductor of the power line connected to the output of the distribution transformer;
- a processor in communication with said first measurement circuit and said second measurement circuit and configured to process data of the measured first voltage and second voltage to detect a trigger condition;
- wherein the trigger condition that said processor is configured to detect comprises (a) and (b) concurrently for at least a first duration:
- (a) a difference between the first voltage and the second voltage that exceeds a first threshold; and
- (b) a sum of the first voltage and the second voltage that is within a predetermined voltage range; and
- wherein said processor is configured to transmit a notification of a detection of the trigger condition to a remote computer.

6. The device according to claim 5, wherein said processor is configured to process data to determine whether the first voltage changes beyond a first threshold within a first predetermined time period and remains beyond the first threshold for at least a second duration.

7. The device according to claim 5, wherein said notification is transmitted wirelessly.

8. The device according to claim 5, wherein the notification includes data sufficient for determining a location of the distribution transformer.

9. A method using a device to detect power grid equipment degradation, comprising:
- measuring a first voltage of a first energized conductor of a power line connected to the output of a distribution transformer supplying power to one or more customer premises;
- processing data of the measured voltage to detect a trigger condition; wherein the trigger condition comprises, at least in part, a change in the first voltage that extends for at least a first duration;
- transmitting a notification of a detection of a trigger condition to a remote computer; and
- measuring a second voltage of a second energized conductor,
- wherein the notification includes data for use in identifying a location of the distribution transformer,
- wherein the trigger condition comprises concurrently for at least the first duration:
- a) a difference between the first voltage and the second voltage that exceeds a first threshold; and
- b) a sum of the first voltage and the second voltage that is within a predetermined voltage range.

10. The method according to claim 9, wherein said providing the notification comprises transmitting the notification over a communication path that includes a medium voltage power line.

11. The method according to claim 9, wherein said providing the notification comprises wirelessly transmitting the notification.

* * * * *